(12) United States Patent
Mouri et al.

(10) Patent No.: US 8,648,632 B2
(45) Date of Patent: Feb. 11, 2014

(54) DIGITAL PLL CIRCUIT, SEMICONDUCTOR INTEGRATED CIRCUIT, AND DISPLAY APPARATUS

(75) Inventors: Hiroki Mouri, Osaka (JP); Kouji Okamoto, Osaka (JP); Fumiaki Senoue, Osaka (JP)

(73) Assignee: Panasonic Corporation, Osaka (JP)

( * ) Notice: Subject to any disclaimer, the term of this patent is extended or adjusted under 35 U.S.C. 154(b) by 179 days.

(21) Appl. No.: 13/313,638

(22) Filed: Dec. 7, 2011

(65) Prior Publication Data

US 2012/0081339 A1 Apr. 5, 2012

Related U.S. Application Data

(63) Continuation of application No. PCT/JP2009/005816, filed on Nov. 2, 2009.

(30) Foreign Application Priority Data

Jun. 10, 2009 (JP) .................................. 2009-139448

(51) Int. Cl.
*H03L 7/06* (2006.01)

(52) U.S. Cl.
USPC .......................................... 327/156; 327/147

(58) Field of Classification Search
USPC ................................................ 327/147, 156
See application file for complete search history.

(56) References Cited

U.S. PATENT DOCUMENTS

| | | | |
|---|---|---|---|
| 5,302,908 A | 4/1994 | Tarusawa et al. | |
| 5,315,269 A | 5/1994 | Fujii | |
| 6,177,842 B1 * | 1/2001 | Ahn et al. | 331/1 A |
| 6,380,776 B1 * | 4/2002 | Yocom | 327/163 |
| 6,429,693 B1 | 8/2002 | Staszewski et al. | |
| 6,985,552 B1 * | 1/2006 | King | 375/376 |
| 7,046,098 B2 | 5/2006 | Staszewski | |
| 7,409,028 B2 * | 8/2008 | Ham, III | 375/376 |
| 8,294,501 B1 * | 10/2012 | Thomas et al. | 327/237 |
| 2002/0190764 A1 * | 12/2002 | Nichols | 327/156 |

(Continued)

FOREIGN PATENT DOCUMENTS

| | | |
|---|---|---|
| JP | 5-37364 | 2/1993 |
| JP | 6-6212 | 1/1994 |
| JP | 2002-76886 | 3/2002 |
| WO | WO 2009/034881 A1 | 3/2009 |

OTHER PUBLICATIONS

International Search Report issued in International Patent Application No. PCT/JP2009/005816, mailed Jan. 26, 2010.

*Primary Examiner* — Adam Houston
(74) *Attorney, Agent, or Firm* — McDermott Will & Emery LLP

(57) ABSTRACT

In a digital PLL circuit, a phase comparison circuit counts the numbers of transitions of a reference clock and an oscillation clock, sets a time taken until the number of transitions of the reference clock reaches a reference count value as a phase comparison time period, and detects, as a phase error value, a difference between a target count value, obtained based on a magnification value of a desired oscillating frequency with respect to the frequency of the reference clock and the reference count value, and the number of transitions of the oscillation clock in the phase comparison time period. A smoothing circuit smoothes the phase error value. A digitally-controlled oscillation circuit controls the frequency of the oscillation clock in accordance with the phase error value smoothed by the smoothing circuit.

12 Claims, 8 Drawing Sheets

(56) References Cited

U.S. PATENT DOCUMENTS

| | | |
|---|---|---|
| 2002/0191727 A1 | 12/2002 | Staszewski et al. |
| 2003/0085743 A1* | 5/2003 | Ullmann et al. ............... 327/156 |
| 2004/0095863 A1* | 5/2004 | Verboom et al. ........... 369/47.28 |
| 2009/0074123 A1* | 3/2009 | Hsueh et al. ................. 375/360 |
| 2009/0256601 A1* | 10/2009 | Zhang et al. .................. 327/156 |
| 2010/0171527 A1 | 7/2010 | Maeda |
| 2010/0260242 A1* | 10/2010 | Abe et al. ...................... 375/219 |
| 2011/0109354 A1* | 5/2011 | Feng et al. .................... 327/156 |
| 2011/0234270 A1* | 9/2011 | Kobayashi .................... 327/156 |
| 2011/0242909 A1* | 10/2011 | Lee ................................ 365/193 |
| 2011/0273210 A1* | 11/2011 | Nagaraj ........................ 327/159 |
| 2012/0081339 A1* | 4/2012 | Mouri et al. .................. 345/204 |
| 2012/0119800 A1* | 5/2012 | Yamasaki et al. ............. 327/142 |
| 2012/0313676 A1* | 12/2012 | Nguyen et al. ................ 327/156 |
| 2013/0002317 A1* | 1/2013 | Frantzeskakis et al. ...... 327/156 |
| 2013/0050013 A1* | 2/2013 | Kobayashi et al. ........... 342/118 |
| 2013/0057327 A1* | 3/2013 | Ferriss et al. ................. 327/156 |
| 2013/0070882 A1* | 3/2013 | Nedovic ........................ 375/373 |
| 2013/0093480 A1* | 4/2013 | Staszewski et al. ........... 327/156 |
| 2013/0181770 A1* | 7/2013 | Sasaki ........................... 329/307 |
| 2013/0187688 A1* | 7/2013 | Wang et al. ................... 327/156 |

* cited by examiner

DIGITAL PLL CIRCUIT, SEMICONDUCTOR INTEGRATED CIRCUIT, AND DISPLAY APPARATUS

CROSS-REFERENCE TO RELATED APPLICATION

This is a continuation of PCT International Application PCT/JP2009/005816 filed on Nov. 2, 2009, which claims priority to Japanese Patent Application No. 2009-139448 filed on Jun. 10, 2009. The disclosures of these applications including the specifications, the drawings, and the claims are hereby incorporated by reference in their entirety.

BACKGROUND

The present disclosure relates to a digital PLL circuit that generates an oscillation clock having a desired oscillating frequency.

Digitized PLL circuits are conventionally known (see Japanese Patent Publication No. 2002-76886 (Patent Document 1), for example). A digital PLL circuit disclosed in Patent Document 1 adds up frequency control words in synchronization with a reference clock to obtain a cumulative value, and also increments a phase value in synchronization with an output clock. This digital PLL circuit calculates the difference between the cumulative value and the phase value as a phase error value, and controls the frequency of the output clock in accordance with the phase error value. In this way, the frequency of the output clock is controlled so that the magnification of the frequency of the output clock with respect to the frequency of the reference clock is equal to the value indicated by the frequency control word. For example, for generation of an output clock of 225 MHz based on a reference clock of 100 MHz, the frequency control word is set at "2.25."

Also, the digital PLL circuit of Patent Document 1 includes a time-to-digital converter for detection of a minute phase error (phase error smaller than one period of the output clock) between the reference clock and the output clock. The time-to-digital converter includes: a delay circuit made of a plurality of cascaded inverters; a plurality of registers configured to hold the outputs of the plurality of inverters in synchronization with a rising edge of the reference clock; and an edge detector configured to detect a time difference between a rising edge of the reference clock and a rising edge of the output clock based on the outputs of the plurality of registers. Having this time-to-digital converter, a minute phase error is detected with the delay time of each inverter as the minimum unit.

SUMMARY

In the digital PLL circuit of Patent Document 1, for the detection of a minute phase error by the time-to-digital converter, the total delay time of the delay circuit (the sum total of the delay times of the inverters) must be longer than one period of the output clock. Therefore, it is difficult to reduce the circuit area and power consumption of the digital PLL circuit. Also, since the interconnect lengths between the adjacent inverters must be equal to each other to ensure that the outputs of the inverters are at equal time intervals, the degree of difficulty of designing the digital PLL circuit is high. Moreover, since the inverters constituted by analog elements have element variations, it is difficult to ensure that all the inverters have the same delay amount.

It is an objective of the present disclosure to provide a digital PLL circuit capable of detecting a minute phase error with a smaller area and lower power consumption than conventionally required.

According to one aspect of the present disclosure, the digital PLL circuit is a circuit configured to generate an oscillation clock having a desired oscillating frequency, including: a phase comparison circuit configured to count the numbers of transitions of a reference clock and the oscillation clock, set a time taken until the number of transitions of the reference clock reaches a predetermined reference count value as a phase comparison time period, and detect, as a phase error value, a difference between a target count value, obtained based on a magnification value of the desired oscillating frequency with respect to the frequency of the reference clock and the reference count value, and the number of transitions of the oscillation clock in the phase comparison time period; a smoothing circuit configured to smooth the phase error value detected by the phase comparison circuit; and a digitally-controlled oscillation circuit configured to control the frequency of the oscillation clock in accordance with the phase error value smoothed by the smoothing circuit. Having the configuration described above, a minute phase difference (a phase difference shorter than one period of the oscillation clock) between the reference clock and the oscillation clock can be detected with a smaller area and lower power consumption than conventionally required, and the frequency of the oscillation clock can be adjusted precisely.

The phase comparison circuit described above may include a time period setting section configured to start counting the number of transitions of the reference clock and detect that the number of transitions of the reference clock has reached the reference count value, an oscillation counting section configured to start counting the number of transitions of the oscillation clock in response to the start of counting by the time period setting section and output a count value of the number of transitions of the oscillation clock as an oscillation count value in response to the detection of having reached the reference count value by the time period setting section, a target setting section configured to set a value obtained by multiplying the reference count value by the magnification value as the target count value, and an error calculation section configured to output a difference between the oscillation count value from the oscillation counting section and the target count value set by the target setting section as the phase error value.

According to another aspect of the present disclosure, the digital PLL circuit is a circuit configured to generate an oscillation clock having a desired oscillating frequency, including: a plurality of phase comparison circuits, respectively corresponding to a plurality of reference clocks, each configured to count the numbers of transitions of the corresponding reference clock and the oscillation clock, set a time taken until the number of transitions of the corresponding reference clock reaches a predetermined reference count value as a phase comparison time period, and detect, as a phase error value, a difference between a target count value, obtained based on a magnification value of the desired oscillating frequency with respect to the frequency of the corresponding reference clock and the reference count value, and the number of transitions of the oscillation clock in the phase comparison time period; a smoothing circuit configured to smooth a total value of the phase error values detected by the plurality of phase comparison circuits; and a digitally-controlled oscillation circuit configured to control the frequency of the oscillation clock in accordance with the total value of the phase error values smoothed by the smoothing circuit. Having the configuration described above, a minute phase difference between the reference clock and the oscillation clock can be detected with a smaller area and lower power consumption than conventionally required, and the frequency of the oscillation clock can be adjusted precisely.

DETAILED DESCRIPTION

Figure 1:
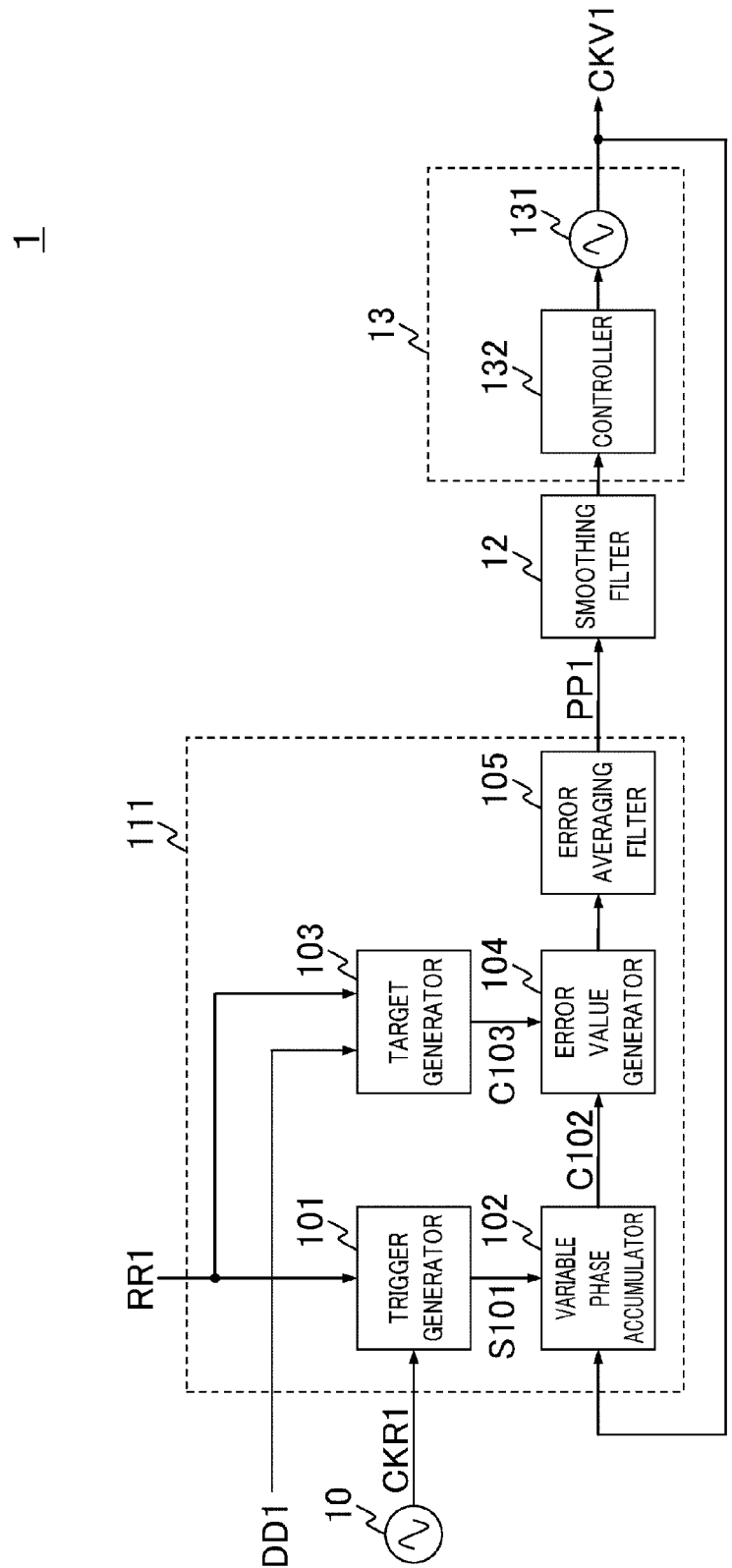
FIG. 1 is a view showing an example configuration of a digital PLL circuit of the first embodiment.

The embodiments of the present disclosure will be described hereinafter in detail with reference to the accompanying drawings. It should be noted that the same or equivalent components are denoted by the same reference characters throughout the drawings and such components will not be described repetitively.

First Embodiment

FIG. 1 shows an example configuration of a digital PLL circuit 1 of the first embodiment. The digital PLL circuit 1, which generates an oscillation clock CKV1 having a desired oscillating frequency, includes a phase comparison circuit 111, a smoothing filter 12 (smoothing circuit), and a digitally-controlled oscillation circuit 13.

The phase comparison circuit 111 counts the numbers of transitions of a reference clock CKR1 from an oscillator 10 and the oscillation clock CKV1. Also, the phase comparison circuit 111 sets the time taken until the number of transitions of the reference clock CKR1 reaches a predetermined reference count value RR1 as a phase comparison time period, and detects a difference between a target count value C103 obtained based on a magnification value DD1 and the reference count value RR1 and an oscillation count value C102 (the number of transitions of the oscillation clock CKV1 in the phase comparison time period) as a phase error value PP1. The magnification value DD1 corresponds with the magnification value of the desired oscillating frequency with respect to the frequency of the reference clock CKR1.

The smoothing filter 12 smoothes the phase error value PP1 detected by the phase comparison circuit 111. The digitally-controlled oscillation circuit 13 controls the frequency of the oscillation clock CKV1 in accordance with the phase error value smoothed by the smoothing filter 12. The digitally-controlled oscillation circuit 13 includes, for example, a clock generator 131 that generates the oscillation clock CKV1 and a controller 132 that controls the clock generator 131 so that the frequency of the oscillation clock CKV1 increases with decrease of the phase error value.

[Example Configuration of Phase Comparison Circuit]

The phase comparison circuit 111 shown in FIG. 1 will be described in detail. The phase comparison circuit 111 includes a trigger generator 101, a variable phase accumulator 102, a target generator 103, an error value generator 104, and an error averaging filter 105.

The trigger generator 101 (time period setting section) starts counting the number of transitions of the reference clock CKR1 and simultaneously outputs the first pulse of a trigger signal S101. Once its count value reaches the reference count value RR1, the trigger generator 101 outputs the next pulse of the trigger signal S101 and simultaneously resets its count value, to restart counting the number of transitions of the reference clock CKR1.

The variable phase accumulator 102 (oscillation counting section) starts counting the number of transitions of the oscillation clock CKV1 in response to the first pulse of the trigger signal S101. Thereafter, in response to the next pulse of the trigger signal, the variable phase accumulator 102 outputs its count value as the oscillation count value C102, and simultaneously resets its count value, to restart counting the number of transitions of the oscillation clock CKV1.

The target generator 103 (target setting section) sets a value obtained by multiplying the reference count value RR1 by the magnification value DD1 as the target count value C103. That is, the target count value C103 corresponds with the oscillation count value C102 output from the variable phase accumulator 102 when the frequency of the oscillation clock CKV1 is equal to the desired oscillating frequency.

The error value generator 104 (error calculation section) outputs, as a phase error value, the difference between the oscillation count value C102 from the variable phase accumulator 102 and the target count value C103 set by the target generator 103. The error averaging filter 105 averages the phase error value from the error value generator 104 and outputs the averaged result as the phase error value PP1. The phase error value obtained by the error value generator 104 may be output as the phase error value PP1 without passing through the error averaging filter 105.

[Operation of Phase Comparison Circuit]

Figure 2:
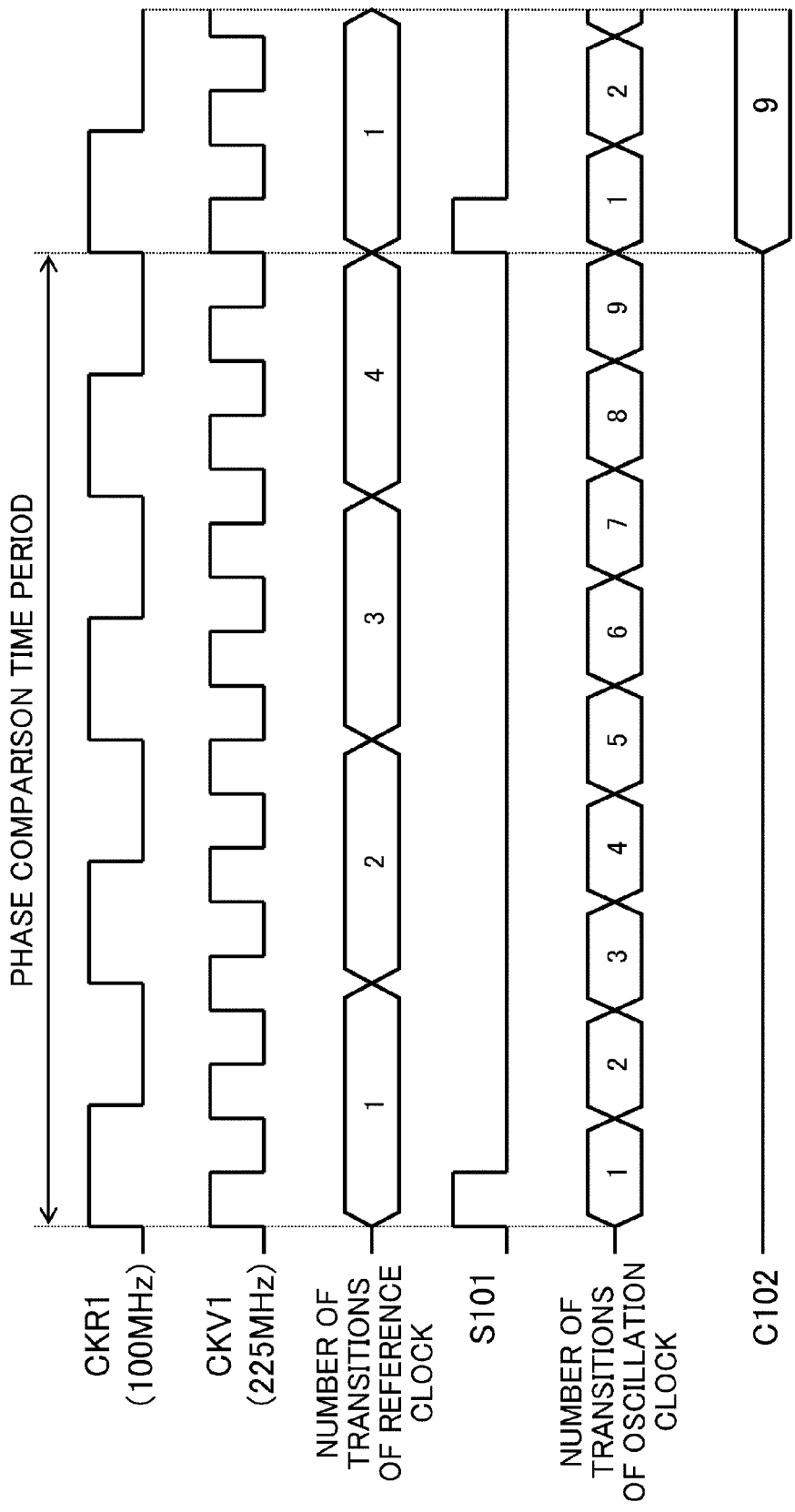
FIG. 2 is a chart for explanation of the operation of a phase comparison circuit shown in FIG. 1.

Referring to FIG. 2, the operation of the phase comparison circuit 111 shown in FIG. 1 will be described. Assume herein that the frequency of the reference clock CKR1 is "100 MHz," the desired oscillating frequency is "225 MHz," and the magnification value DD1 is "2.25 (=225/100)." Assume also that the reference count value RR1 is "4," and the target count value C102 is "9 (=4×2.25)."

First, the trigger generator 101 starts counting the number of transitions (the number of rising edges in the illustrated example) of the reference clock CKR1, and simultaneously outputs a pulse of the trigger signal S101. The variable phase accumulator 102 starts counting the number of transitions of the oscillation clock CKV1 in response to the output of the trigger signal S101. When the count value by the trigger generator 101 reaches "4," the trigger generator 101 outputs the next pulse of the trigger signal S101. Simultaneously with the output of the trigger signal S101, the trigger generator 101 resets its count value and restarts counting the number of transitions of the reference clock CKR1. In response to the output of the trigger signal S101, also, the variable phase accumulator 102 outputs its count value "9" as the oscillation count value C102. Simultaneously with the output of the oscillation count value C102, the variable phase accumulator 102 resets its count value and restarts counting the number of transitions of the oscillation clock CKV1. In this way, the number of transitions of the oscillation clock CKV1 in the time period starting from the output of one pulse of the trigger signal S101 until the output of the next pulse thereof (phase comparison time period) is output as the oscillation count value C102.

As shown in FIG. 2, when the frequency of the oscillation clock CKV1 is equal to (or approximately equal to) the desired oscillating frequency, the oscillation count value C102 is equal to the target count value "9." When the frequency of the oscillation clock CKV1 is higher than the desired oscillating frequency, the oscillation count value C102 is larger than the target count value C103, whereby the phase error value PP1 indicates a positive value. Conversely, when the frequency of the oscillation clock CKV1 is lower than the desired oscillating frequency, the oscillation count value C102 is smaller than the target count value C103, whereby the phase error value PP1 indicates a negative value. Moreover, the larger the difference between the frequency of the oscillation clock CKV1 and the desired oscillating frequency, the larger the difference between the oscillation count value C102 and the target count value C103 becomes.

As described above, by detecting the difference between the oscillation count value C102 and the target count value C103 as the phase error value, it is possible to detect a minute phase error between the reference clock CKR1 and the oscillation clock CKV1 (a phase error smaller than one period of the oscillation clock CKV1). Thus, with no need to use a time-to-digital converter, the detection of a minute phase error can be achieved with a smaller area and lower power consumption than conventionally required, and the frequency of the oscillation clock CKV1 can be adjusted precisely.

Second Embodiment

Figure 3:
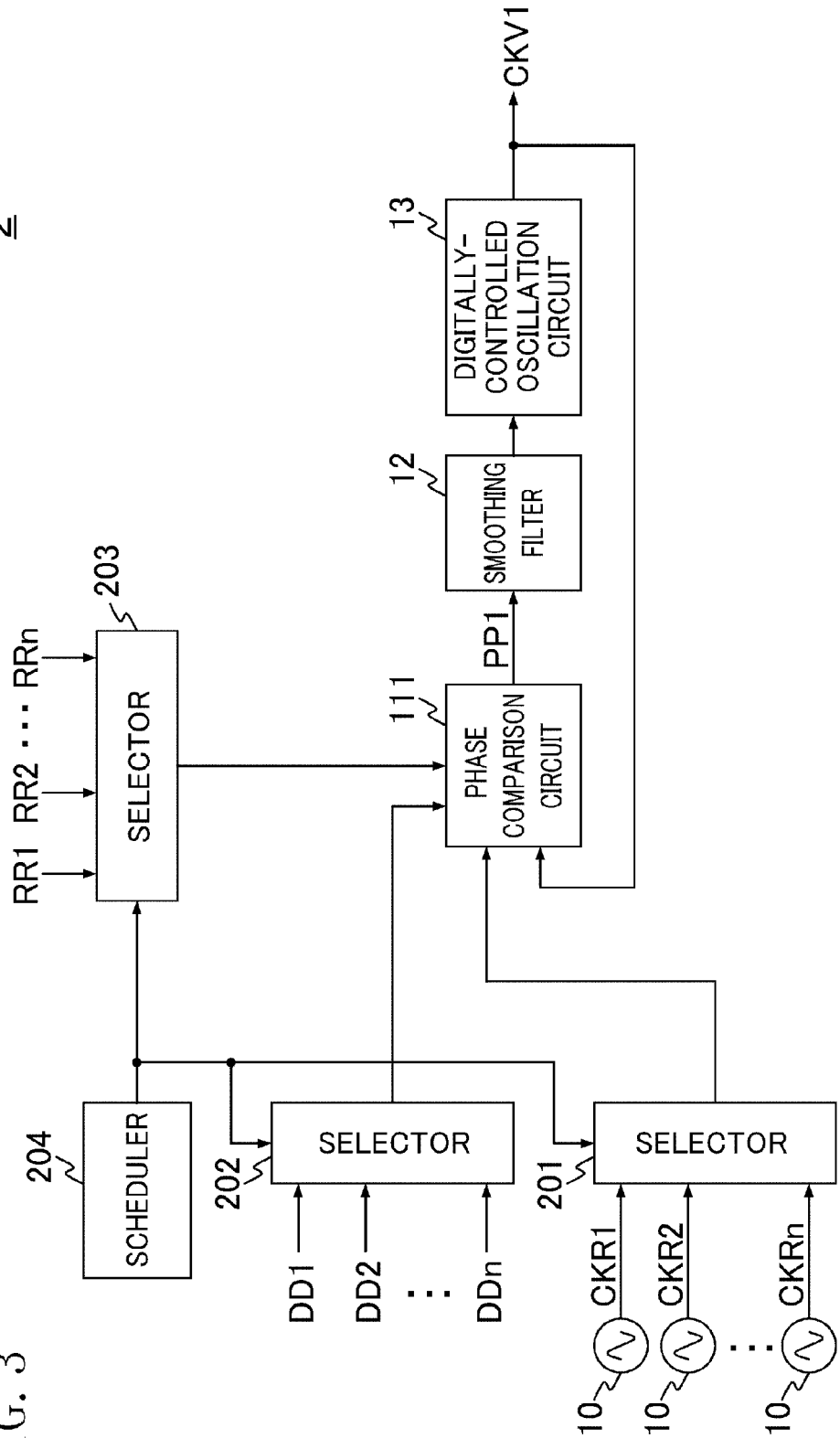
FIG. 3 is a view showing an example configuration of a digital PLL circuit of the second embodiment.

FIG. 3 shows an example configuration of a digital PLL circuit 2 of the second embodiment. The digital PLL circuit 2 includes selectors 201, 202, and 203 and a scheduler 204 in addition to the components of the PLL circuit 1 of FIG. 1.

The selector 201 (reference clock selection section) selects one of n (n is an integer equal to or more than 2) reference clocks CKR1, CKR2, ..., CKRn in response to the control by the scheduler 204, and supplies the selected one to the phase comparison circuit 111. The reference clocks CKR1, CKR2, ..., CKRn have frequencies different from each other.

The selector 202 (magnification value selection section) selects one of n magnification values DD1, DD2, ..., DDn in response to the control by the scheduler 204, and supplies the selected one to the phase comparison circuit 111. The magnification values DD1, DD2, ..., DDn respectively correspond to the reference clocks CKR1, CKR2, ..., CKRn. For example, when the reference clocks CKR1, CKR2, and CKR3 are respectively "100 MHz," "10 MHz," and "1 MHz," the magnification values DD1, DD2, and DD3 may respectively indicate "2.25," "22.5," and "225."

The selector 203 (reference count value selection section) selects one of n reference count values RR1, RR2, ..., RRn in response to the control by the scheduler 204, and supplies the selected one to the phase comparison circuit 111. The reference count values RR1, RR2, ..., RRn respectively correspond to the reference clocks CKR1, CKR2, ..., CKRn. For example, when the reference clocks CKR1, CKR2, and CKR3 are respectively "100 MHz," "10 MHz," and "1 MHz," the reference count values RR1, RR2, and RR3 may respectively indicate "4," "2," and "1."

The scheduler 204 controls the selectors 201, 202, and 203 in accordance with the phase error value PP1 (or the phase error value obtained by the error value generator 104). For example, the scheduler 204 instructs the selectors 201, 202, and 203 to select a reference clock, a magnification value, and a reference count value, respectively. When the phase error value PP1 fails to fall within a predetermined range (e.g., a range in which the clock is considered to be in the phase-locked state) within a predetermined time after this selection, the scheduler 204 instructs the selectors 201, 202, and 203 to reselect a reference clock, a magnification value, and a reference count value, respectively. In this way, one combination of the reference clock, the magnification value, and the reference count value is switched to another combination in a predetermined order until the phase error value PP1 falls within the predetermined range. For example, the selection is performed in the order of the combination of the reference clock CKR1, the magnification value DD1, and the reference count value RR1, the combination of the reference clock CKR2, the magnification value DD2, and the reference count value RR2, . . . , and the combination of the reference clock CKRn, the magnification value DDn, and the reference count value RRn.

As described above, by switching the combination of the reference clock, the magnification value, and the reference count value sequentially to find the optimum combination, the frequency acquisition characteristic can be optimized.

The digital PLL circuit 2 may further include a lock detection circuit that detects matching of the frequency of the oscillation clock CKV1 with the desired oscillating frequency (e.g., the frequency of a broadcasting station designated by the user). In this case, the scheduler 204 may switch the combination of the reference clock, the magnification value, and the reference count value from one to another until the lock detection circuit detects matching of the frequency of the oscillation clock CKV1 with the desired oscillating frequency.

Third Embodiment

Figure 4:
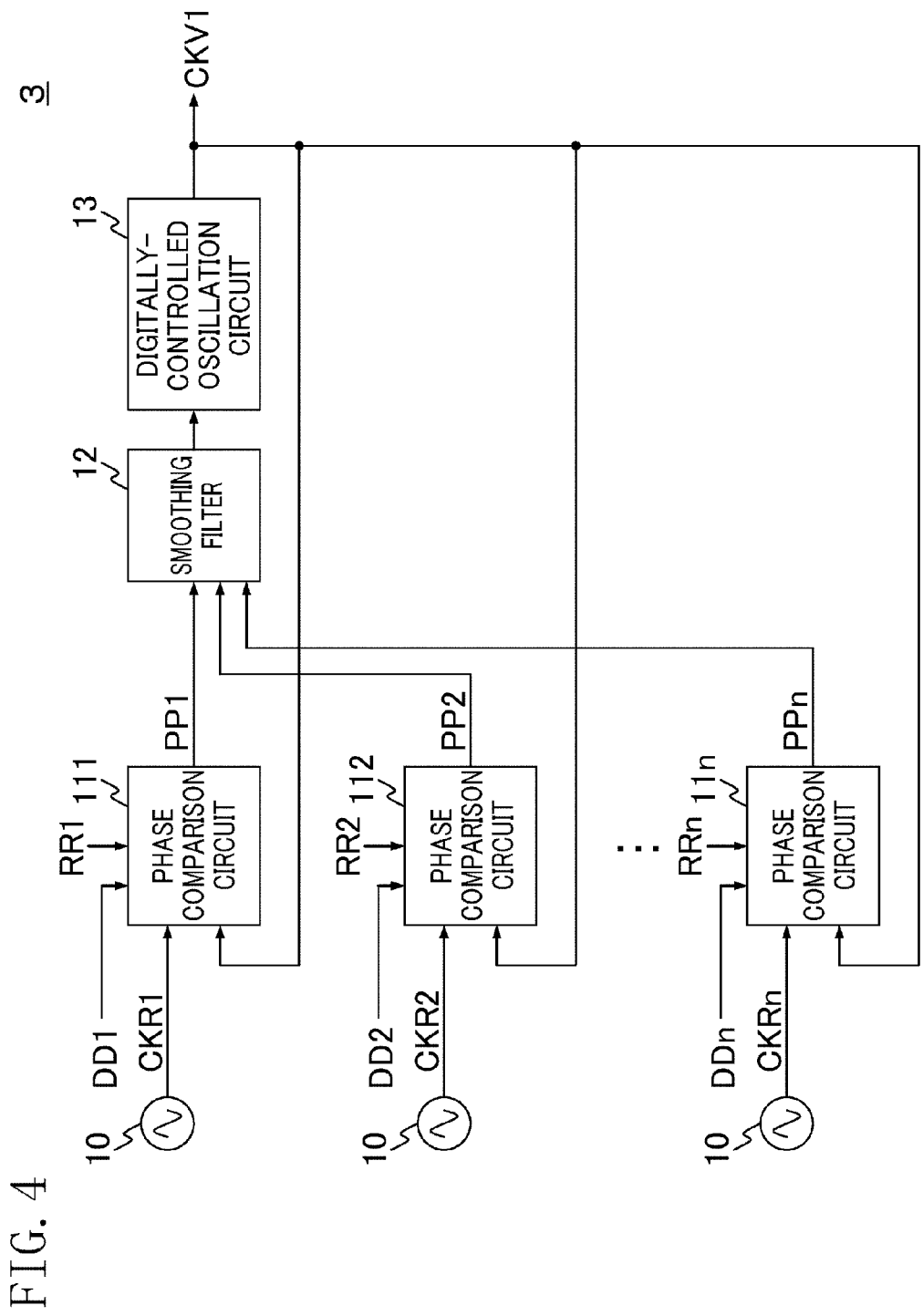
FIG. 4 is a view showing an example configuration of a digital PLL circuit of the third embodiment.

FIG. 4 shows an example configuration of a digital PLL circuit 3 of the third embodiment. The digital PLL circuit 3 includes (n−1) phase comparison circuits 112, . . . , 11n in addition to the components of the PLL circuit 1 of FIG. 1. The phase comparison circuits 112, . . . , 11n have a configuration similar to the phase comparison circuit 111 shown in FIG. 1.

The phase comparison circuits 111, 112, . . . , 11n receive the oscillation clock CKV1, and respectively receive the reference clocks CKR1, CKR2, . . . , CKRn. Also, the reference count values RR1, RR2, . . . , RRn and the magnification values DD1, DD2, . . . , DDn are respectively set in the phase comparison circuits 111, 112, . . . , 11n. The reference clocks CKR1, CKR2, . . . , CKRn have frequencies different from one another. The reference count values RR1, RR2, . . . , RRn respectively correspond to the reference clocks CKR1, CKR2, . . . , CKRn. In other words, the phase comparison circuits 111, 112, . . . , 11n detect phase error values PP1, PP2, . . . , PPn at different timing points.

The smoothing filter 12 smoothes the total value of the phase error values PP1, PP2, . . . , PPn detected by the phase comparison circuits 111, 112, . . . , 11n. The digitally-controlled oscillation circuit 13 controls the frequency of the oscillation clock CKV1 in accordance with the total value of the phase error values PP1, PP2, . . . , PPn smoothed by the smoothing filter 12. For example, the digitally-controlled oscillation circuit 13 controls the frequency of the oscillation clock CKV1 so that the frequency increases with decrease of the output of the smoothing filter 12.

Having the configuration described above, the frequency response characteristic can be improved.

Fourth Embodiment

Figure 5:
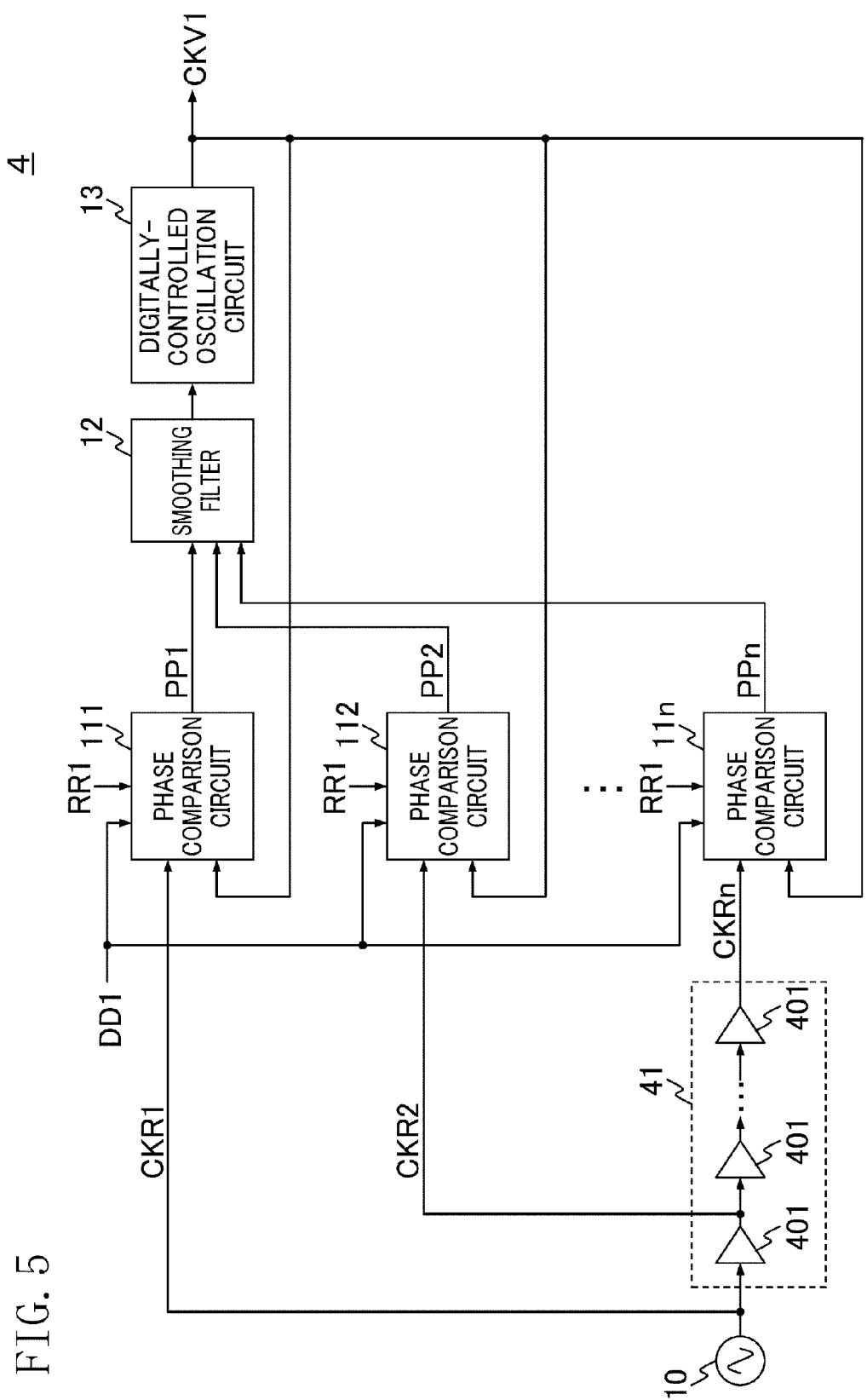
FIG. 5 is a view showing an example configuration of a digital PLL circuit of the fourth embodiment.

FIG. 5 shows an example configuration of a digital PLL circuit 4 of the fourth embodiment. The digital PLL circuit 4 includes a delay circuit 41 in addition to the components of the PLL circuit 3 of FIG. 4. The delay circuit 41 delays the reference clock CKR1 sequentially to output the reference clocks CKR2, ..., CKRn having phases different from each other. The delay circuit 41 includes (n−1) cascaded delay elements 401, 401, ..., for example. It is preferable that the delay time of the delay circuit 41 (total of the delay times of the delay elements 401, 401, ...) is equal to or smaller than one period of the oscillation clock CKV1.

The phase comparison circuits 111, 112, ..., 11n respectively receive the reference clock CKR1 and the reference clocks CKR2, ..., CKRn (outputs of the delay elements 401, 401, ...) from the delay circuit 41. Also, the phase comparison circuits 111, 112, ..., 11n receive the oscillation clock CKV1, and have the same reference count value RR1 and the same magnification value DD1 set therein. In other words, the phase comparison circuits 111, 112, ..., 11n detect the phase error values PP1, PP2, ..., PPn at different timing points.

Having the configuration described above, the phase error can be detected with high precision.

Variation of Fourth Embodiment

Figure 6:
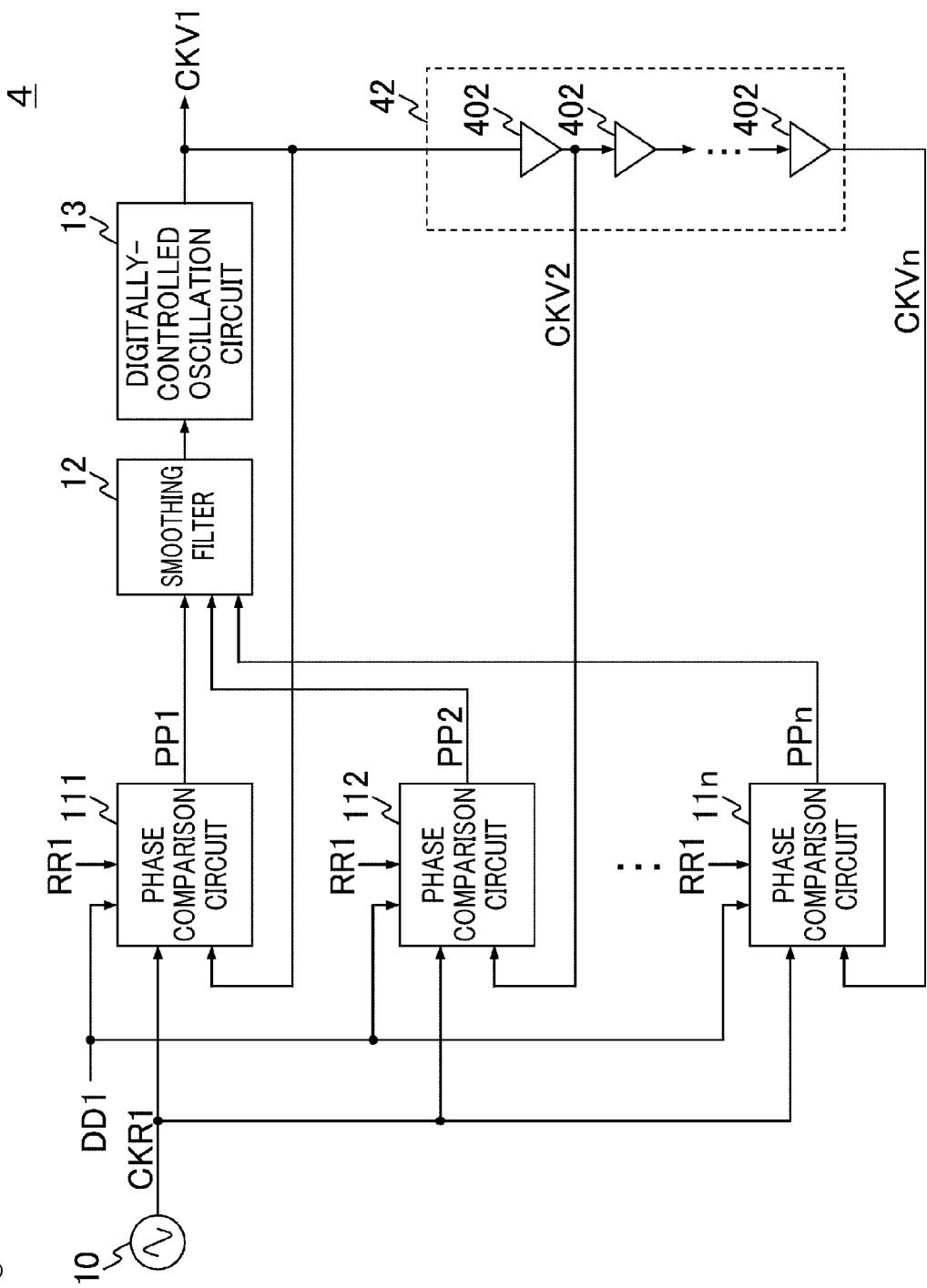
FIG. 6 is a view showing a variation of the digital PLL circuit of the fourth embodiment.

As shown in FIG. 6, the digital PLL circuit 4 may include a delay circuit 42 in place of the delay circuit 41 shown in FIG. 5. The delay circuit 42 delays the oscillation clock CKV1 sequentially to output oscillation clocks CKV2, ..., CKVn. The delay circuit 42 includes (n−1) cascaded delay elements 402, 402, ..., for example. It is preferable that the delay time of the delay circuit 42 (total of the delay times of the delay elements 402, 402, ...) is equal to or smaller than one period of the oscillation clock CKV1.

The phase comparison circuits 111, 112, ..., 11n respectively receive the oscillation clock CKV1 and the oscillation clocks CKV2, ..., CKVn (outputs of the delay elements 402, 402, ...) from the delay circuit 42. Also, the phase comparison circuits 111, 112, ..., 11n receive the same reference clock CKR1, and have the same reference count value RR1 and the same magnification value DD1 set therein.

The configuration described above eliminates the necessity of using a plurality of oscillators.

(Gain Adjustment Circuit)

Figure 7:
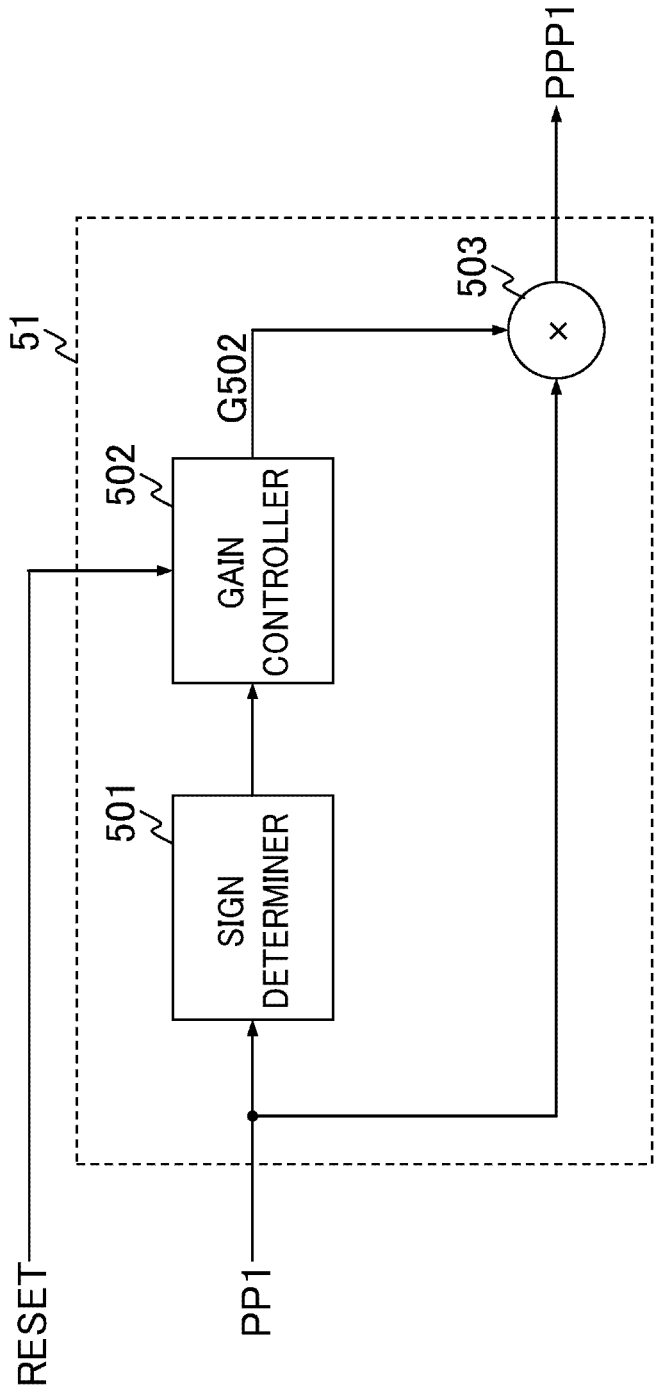
FIG. 7 is a view illustrating a gain adjustment circuit.

The digital PLL circuits 1, 2, 3, and 4 may further include a gain adjustment circuit 51 shown in FIG. 7. The gain adjustment circuit 51 includes a sign determiner 501, a gain controller 502, and a multiplier 503, for example. The sign determiner 501 determines whether the sign of the phase error value PP1 is positive or negative every time the phase error value PP1 is updated. The gain controller 502 outputs a gain value G502 based on the determination result from the sign determiner 501. For example, the gain controller 502 renders the gain value G502 smaller as the number of times the same determination result appears consecutively is larger exceeding a predetermined value (i.e., as the clock is closer to the phase-locked state). Also, when receiving a reset signal RESET, the gain controller 502 outputs the gain value G502 indicating "1." The reset signal RESET is supplied when the system having the PLL circuit is in a stable state (e.g., a state where the clock is stable in the phase-locked state, a state where the phase error value is approximately zero, a state where the radio wave is being received without disturbance, etc.), for example. The multiplier 503 multiplies the phase error value PP1 by the gain value G502 and outputs the multiplication result to the smoothing filter 12 as a phase error value PPP1.

As described above, the gain adjustment circuit 51 repeatedly determines the sign of the phase error value PP1 and increases/decreases the phase error value PP1 in accordance with the number of times the same determination result appears consecutively. With this operation, the transition time from a non-phase-locked state to the phase-locked state can be shortened, and also transition from the phase-locked state to a non-phase-locked state can be prevented or reduced.

Also, when receiving the reset signal RESET, the gain adjustment circuit 51 outputs the phase error value PP1 as the phase error value PPP1 as it is without increase/decrease of the phase error value PP1. This makes it possible to prevent increase in power consumption due to unnecessary gain control.

When applied to the digital PLL circuits shown in FIGS. 4, 5, and 6, the gain adjustment circuit 51 may execute the gain control described above for the total value of the phase error values PP1, PP2, ..., PPn.

(Semiconductor Integrated Circuit, Display Apparatus)

Figure 8:
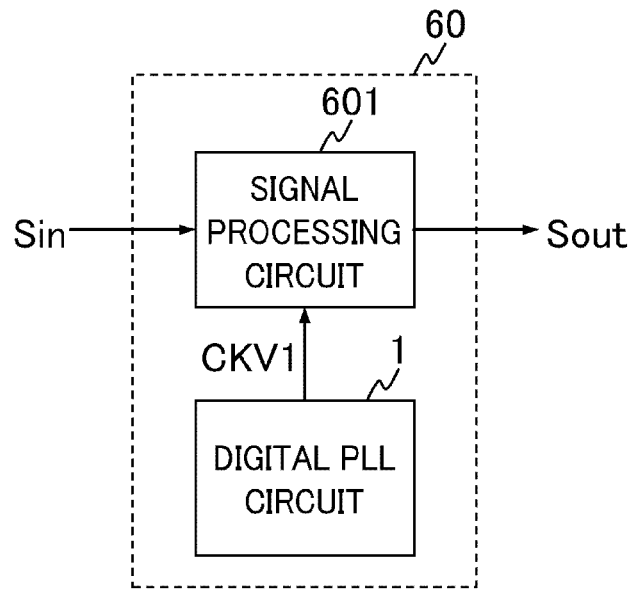
FIG. 8 is a view illustrating a semiconductor integrated circuit including the digital PLL circuit of FIG. 1.

As shown in FIG. 8, the digital PPL circuits 1, 2, 3, and 4 may be incorporated in a semiconductor integrated circuit. A semiconductor integrated circuit 60 shown in FIG. 8 includes a signal processing circuit 601 in addition to the digital PLL circuit 1. The signal processing circuit 601 processes an input signal Sin and outputs an output signal Sout, in synchronization with the oscillation clock CKV1 from the digital PLL circuit 1. The input signal Sin may be supplied via a radio communication path or a wire communication path (e.g., an optical fiber, a coaxial cable, a power line path, etc.).

Figure 9:
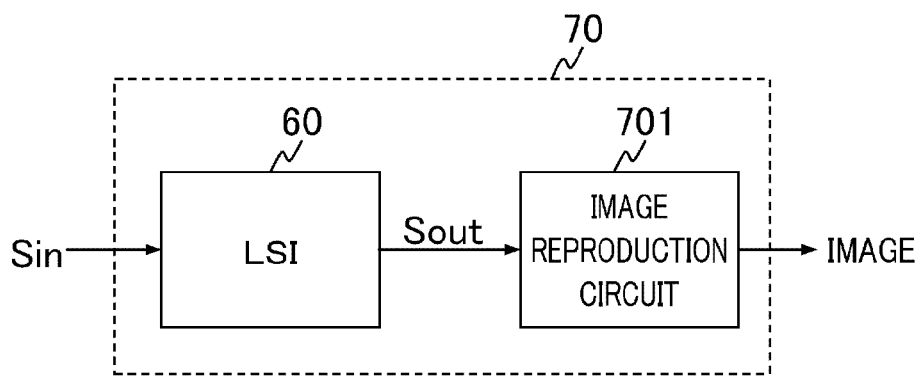
FIG. 9 is a view illustrating a display apparatus including the semiconductor integrated circuit of FIG. 8.

Moreover, as shown in FIG. 9, the semiconductor integrated circuit 60 may be incorporated in a display apparatus (e.g., a plasma TV set, a liquid crystal TV set, a mobile phone, etc.) and a communication apparatus (e.g., a radio, etc.). A display apparatus 70 shown in FIG. 9 includes an image reproduction circuit 701 (e.g., a display) in addition to the semiconductor integrated circuit 60. The image reproduction circuit 701 reproduces an image from the output signal Sout (video signal) received from the semiconductor integrated circuit 60.

Thus, the digital PLL circuits described above, which can detect a minute phase error with a small area and low power consumption, are useful as clock generation circuits incorporated in a display apparatus, a communication apparatus, etc.

What is claimed is:

1. A digital PLL circuit configured to generate an oscillation clock having a desired oscillating frequency, comprising:
   a phase comparison circuit configured to count the numbers of transitions of a reference clock and the oscillation clock, set a time taken until the number of transitions of the reference clock reaches a predetermined reference count value as a phase comparison time period, and detect, as a phase error value, a difference between a target count value, obtained based on a magnification value of the desired oscillating frequency with respect to the frequency of the reference clock and the reference count value, and the number of transitions of the oscillation clock in the phase comparison time period;
   a smoothing circuit configured to smooth the phase error value detected by the phase comparison circuit; and
   a digitally-controlled oscillation circuit configured to control the frequency of the oscillation clock in accordance with the phase error value smoothed by the smoothing circuit.

2. The digital PLL circuit of claim 1, wherein the phase comparison circuit includes:
   a time period setting section configured to start counting the number of transitions of the reference clock and detect that the number of transitions of the reference clock has reached the reference count value, an oscillation counting section configured to start counting the number of transitions of the oscillation clock in response to the start of counting by the time period setting section and output a count value of the number of transitions of the oscillation clock as an oscillation count value in response to the detection of having reached the reference count value by the time period setting section, a target setting section configured to set a value obtained by multiplying the reference count value by the magnification value as the target count value, and an error calculation section configured to output a difference between the oscillation count value from the oscillation counting section and the target count value set by the target setting section as the phase error value.

3. The digital PLL circuit of claim 1, further comprising:

a reference clock selection section configured to select one of a plurality of reference clocks having frequencies different from each other and supply the selected reference clock to the phase comparison circuit;

a magnification value selection section configured to select one of a plurality of magnification values corresponding to the plurality of reference clocks and supply the selected magnification value to the phase comparison circuit; and a reference count value selection section configured to select one of a plurality of reference count values corresponding to the plurality of reference clocks and supply the selected reference count value to the phase comparison circuit.

4. The digital PLL circuit of claim 1, further comprising:

a gain adjustment circuit configured to increase/decrease the phase error value detected by the phase comparison circuit and supply the resultant value to the smoothing circuit.

5. The digital PLL circuit of claim 4, wherein the gain adjustment circuit executes processing of determining whether the sign of the phase error value detected by the phase comparison circuit is positive or negative repeatedly, increases/decreases the phase error value in accordance with the number of times the same determination result appears consecutively, and supplies the resultant value to the smoothing circuit.

6. The digital PLL circuit of claim 4, wherein when receiving a reset signal, the gain adjustment circuit supplies the phase error value detected by the phase comparison circuit to the smoothing circuit as it is without increasing/decreasing the phase error value.

7. A digital PLL circuit configured to generate an oscillation clock having a desired oscillating frequency, comprising:

a plurality of phase comparison circuits, respectively corresponding to a plurality of reference clocks, each configured to count the numbers of transitions of the corresponding reference clock and the oscillation clock, set a time taken until the number of transitions of the corresponding reference clock reaches a predetermined reference count value as a phase comparison time period, and detect, as a phase error value, a difference between a target count value, obtained based on a magnification value of the desired oscillating frequency with respect to the frequency of the corresponding reference clock and the reference count value, and the number of transitions of the oscillation clock in the phase comparison time period;

a smoothing circuit configured to smooth a total value of the phase error values detected by the plurality of phase comparison circuits; and a digitally-controlled oscillation circuit configured to control the frequency of the oscillation clock in accordance with the total value of the phase error values smoothed by the smoothing circuit.

8. The digital PLL circuit of claim 7, wherein the plurality of reference clocks have frequencies different from each other.

9. The digital PLL circuit of claim 7, wherein the plurality of reference clocks have phases different from each other.

10. The digital PLL circuit of claim 7, further comprising:

a delay circuit configured to generate a plurality of delayed oscillation clocks by delaying the oscillation clock from the digitally-controlled oscillation circuit sequentially, wherein each of the phase comparison circuits corresponds to the oscillation clock from the digitally-controlled oscillation circuit or one of the plurality of delayed oscillation clocks.

11. A semiconductor integrated circuit, comprising:

a digital PLL circuit configured to generate an oscillation clock having a desired oscillating frequency, the digital PLL circuit comprising:

a phase comparison circuit configured to count the numbers of transitions of a reference clock and the oscillation clock, set a time taken until the number of transitions of the reference clock reaches a predetermined reference count value as a phase comparison time period, and detect, as a phase error value, a difference between a target count value, obtained based on a magnification value of the desired oscillating frequency with respect to the frequency of the reference clock and the reference count value, and the number of transitions of the oscillation clock in the phase comparison time period;

a smoothing circuit configured to smooth the phase error value detected by the phase comparison circuit; and a digitally-controlled oscillation circuit configured to control the frequency of the oscillation clock in accordance with the phase error value smoothed by the smoothing circuit;

and a signal processing circuit configured to process a signal in synchronization with the oscillation clock from the digital PLL circuit.

12. A display apparatus, comprising:

the semiconductor integrated circuit of claim 11; and an image reproduction circuit configured to reproduce an image from the signal processed by the semiconductor integrated circuit.

* * * * *